United States Patent [19]

Ragan

[11] Patent Number: 5,029,237
[45] Date of Patent: Jul. 2, 1991

[54] RADIO RECEIVER FREQUENCY CONTROL SYSTEM

[75] Inventor: Lawrence H. Ragan, Richardson, Tex.

[73] Assignee: AT&E Corporation, San Francisco, Calif.

[21] Appl. No.: 388,228

[22] Filed: Aug. 1, 1989

Related U.S. Application Data

[63] Continuation-in-part of Ser. No. 213,719, Jun. 30, 1988, Pat. No. 4,885,802.

[51] Int. Cl.⁵ .......................... H04B 1/06; H04B 1/16
[52] U.S. Cl. .................................... 455/182; 455/183; 455/255; 455/262; 455/343
[58] Field of Search ............... 455/182, 183, 192, 207, 455/209, 226, 228, 343, 314, 315, 260, 262

[56] References Cited

U.S. PATENT DOCUMENTS

| | | | |
|---|---|---|---|
| 4,365,349 | 12/1982 | Ogita et al. | 455/192 |
| 4,384,361 | 5/1983 | Masaki | 455/343 |
| 4,521,918 | 6/1985 | Cheillen | 455/343 |
| 4,590,618 | 5/1986 | Heath et al. | 455/343 |
| 4,598,288 | 7/1986 | Babano | 455/343 |
| 4,631,496 | 12/1986 | Borras et al. | 455/343 |
| 4,703,520 | 10/1987 | Rozanski, Jr. et al. | 455/75 |
| 4,713,808 | 12/1987 | Gaskill et al. | 370/93 |
| 4,743,857 | 5/1988 | Childers | 331/1 A |
| 4,743,864 | 5/1988 | Nakagawa et al. | 331/14 |
| 4,890,094 | 1/1990 | Herold et al. | 455/343 |

*Primary Examiner*—Reinhard J. Eisenzopf
*Assistant Examiner*—Lisa Charouel
*Attorney, Agent, or Firm*—Elmer W. Galbi

[57] ABSTRACT

Frequency control in a miniature receiver is effected by a synthesizer that is operated briefly to provide a tuning voltage to a voltage controlled local oscillator. A capacitor is shunted across the output of the synthesizer and is charged to the level of the tuning voltage. After the capacitor is charged, the synthesizer is deenergized and the diminishing voltage provided to the oscillator by the discharging capacitor is correspondingly supplemented by an AFC voltage that tracks drift of the received signal in the IF passband. The deenergizing of the synthesizer eliminates synthesizer noise and reduces the receiver's power consumption.

1 Claim, 2 Drawing Sheets

RADIO RECEIVER FREQUENCY CONTROL SYSTEM

RELATED APPLICATION DATA

This application is a continuation-in-part of copending allowed application Ser. No. 07/213,719, now U.S. Pat. No. 4,885,802 filed June 30, 1988 the disclosure of which is incorporated herein by reference.

FIELD OF THE INVENTION

The present invention relates to receivers, and more particularly relates to synthesized receivers in which noise or power constraints make operation of the synthesizer undesirable.

BACKGROUND AND SUMMARY OF THE INVENTION

Radio paging systems are increasingly becoming part of the infrastructure of our "information age" society. No longer is their use limited to summoning doctors and emergency response technicians. Instead, they are used for virtually all communications tasks. Commonplace applications for radio paging systems now include office paging (in lieu of public address paging) and relaying grocery lists to spouses on their ways home from work.

While radio paging systems have previously been local in nature, newer systems offer virtually instant point-to-point communications anywhere on the globe. U.S. Pat. No. 4,713,808 to Gaskill et al., the disclosure of which is incorporated herein by reference, is exemplary of such new global paging technology.

Before radio paging systems can become truly ubiquitous, the receiving technology used in the personal paging receivers must be improved, both in convenience and technological sophistication. Traditionally, paging receivers have been box-like devices that must be clipped to a belt. More recently, pocket pagers have been developed. However, both of these two approaches still require the user to carry an additional item on his or her person.

More promising is the approach disclosed in the Gaskill patent in which a pager is incorporated into a conventional electronic wristwatch. Although much more convenient than prior art paging receivers, the patented Gaskill system confronts several technical challenges.

One such challenge is the issue of shielding different sections of the receiver from one another. Due to space constraints, shielding in the wristwatch sized enclosure is essentially unobtainable. Since noise from one circuit cannot be isolated from others, it must be eliminated.

An example of the shielding problem is in the frequency control circuits. The Gaskill system relies on a frequency agile receiver that scans the FM broadcast spectrum for a signal having paging data on a subcarrier thereof. The frequency agility is effected by a microprocessor controlled oscillator, such as a fractional-N synthesizer. Such digital synthesizers are electrically quite noisy and are typically isolated from other circuitry by adequate shielding. In the wristwatch enclosure, however, such shielding cannot be achieved without substantial penalties in cost, size and weight. Nor can the frequency agility be achieved without the synthesizer.

In accordance with the present invention, this noise problem is overcome by operating the digital synthesizer only at the beginning of each listening interval. After the receiver has stabilized, the synthesizer is shut down and frequency control is thereafter assumed by an automatic frequency control (AFC) system that maintains the receiver on the desired frequency. In addition to eliminating synthesizer noise, this AFC operation also cuts power consumption by the receiver.

The foregoing and additional features and advantages of the present invention will be more readily apparent from the following detailed description, which proceeds with reference to the accompanying drawings.

DETAILED DESCRIPTION

Figure 1:
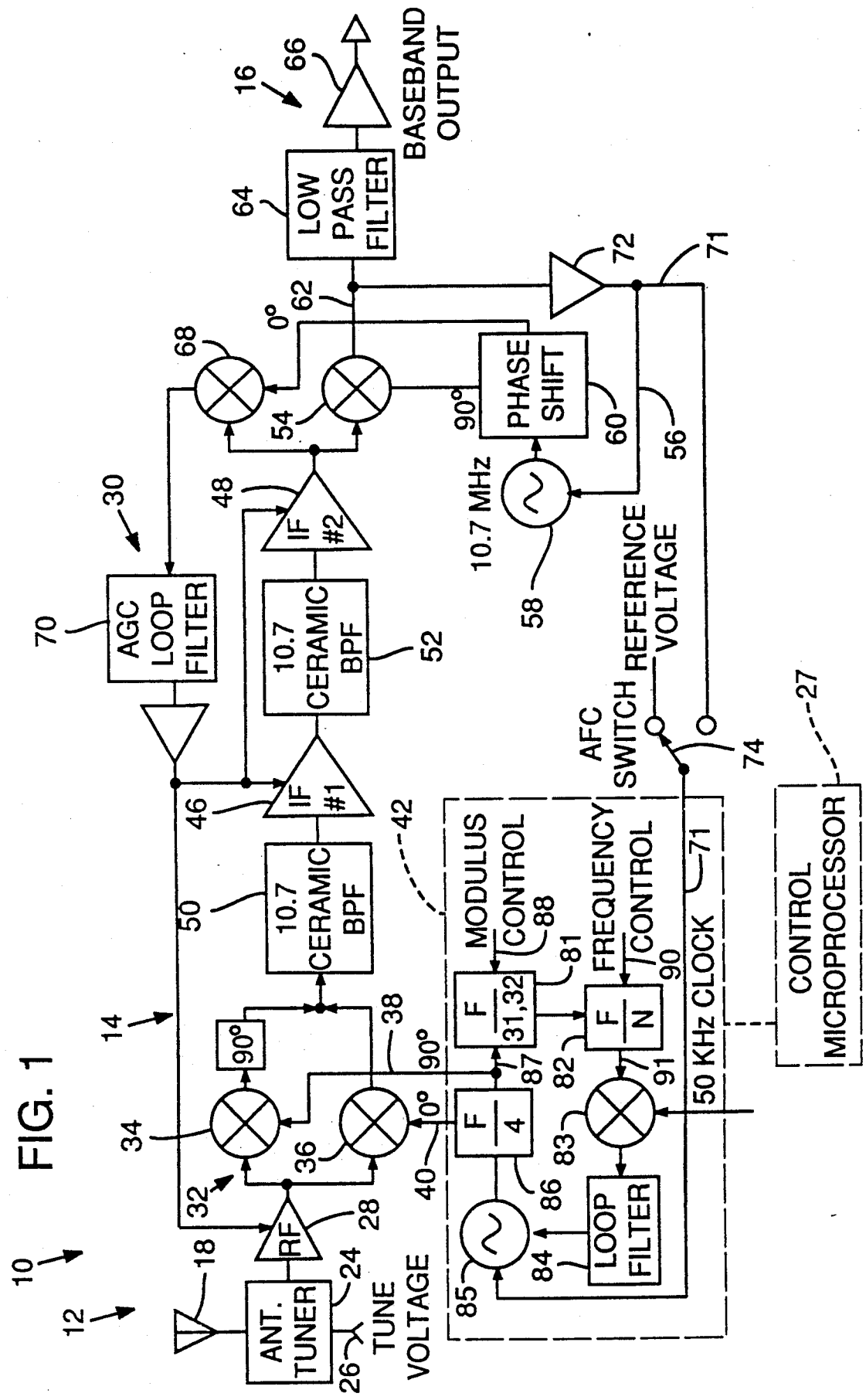
FIG. 1 is a block diagram of a wristwatch FM receiver according to the present invention.

Referring to FIG. 1 the preferred embodiment of the present invention 10 includes an RF stage 12, an IF stage 14 and a baseband stage 16. The RF stage 12 includes an antenna 18 which may be fabricated into the wristband 20 of a wristwatch 22 in which the receiver 10 is mounted. (A suitable wristwatch enclosure is described in the Gaskill et al. patent). The antenna 18 provides RF signals to an antenna tuner stage 24.

Antenna tuner stage 24 can be a varactor controlled notch filter which also performs limited impedance matching functions. A tuning voltage is applied to a tune voltage port 26 from a microprocessor based control system 27, such as is discussed in Gaskill et al. This voltage tunes a voltage-variable capacitor in tuner 24 which places the null of a notch filter at the image of the frequency to which the receiver is tuned. (This element of the invention can readily be omitted in alternative embodiments if image rejection is not a problem).

The antenna tuner 24 also serves a limited impedance transformation function. The antenna 18 with which the receiver 10 is used is typically a very small loop and consequently has a very small impedance. Receiver performance and noise figure are optimized if this impedance is transformed up to more closely match the input impedance of the following RF amplifier stage 28.

RF amplifier stage 28 is a low noise broadband amplifier tuned for maximum gain in the FM broadcast band (88-108 megahertz). The maximum gain of RF amplifier stage 28 is approximately 10 dB. Its actual gain is controlled by an AGC control circuit 30 discussed below. Since there is little in the way of preselector circuitry in or before the RF amplifier stage 28, the following receiver mixer stage 32 is provided with a wide band of amplified input signals.

To minimize the effect of image signals which pass the tuner stage 24, mixer stage 32 is configured in an image cancelling topology. Two individual mixers 34, 36 are driven with quadrature local oscillator signals on lines 38, 40 from a local oscillator 42. High side injection is generally used, so the local oscillator tunes the 98.7 to 118.7 megahertz range to yield a 10.7 megahertz intermediate frequency. (In some foreign countries, the adjoining frequencies are allocated to different services and it may be desirable to use low side injection instead). The local oscillator 42 is discussed in greater detail below.

The output of the mixer 34 driven from local oscillator line 38 is delayed 90 degrees and is combined with the output of the mixer 36 that is driven from the delayed local oscillator line 40. The combination of these signals cancels any image response while reinforcing the desired signal response. Mixer 32 has a conversion gain at the desired signal frequency of approximately 7 dB.

The output of mixer stage 32 is provided to an IF chain 14 comprised of two IF amplifiers 46, 48 and two ceramic band pass filters 50, 52. Filters 50, 52 are desirably of non-identical design so as to avoid co-location of spurious filter responses within the IF pass band. The filters are of chip construction and may be of the SFEC 10.7 series manufactured by Murata. IF amplifiers 46, 48 have gains of approximately 20 dB each and filters 50, 52 have about 6 dB each of loss. The IF amplifiers 46, 48 are gain controlled, as discussed below, to optimize signal-to-noise ratio.

The output of IF chain 14 is provided to a synchronous, or coherent detector comprised of a mixer 54 injected with a 10.7 megahertz signal from a second local oscillator 58. The synchronous detection technique permits detection at a much lower signal level than would be possible if a limiter or discriminator stage was employed. Consequently, the IF stage gain can be lower than would normally be the case, thereby reducing the risk of oscillation caused by stray feedback. Synchronous detection also requires fewer and simpler off-chip components than alternative detection techniques and is simpler to adjust.

The local oscillator 58 providing the 10.7 megahertz signal to the synchronous detector 54 is locked to the frequency of the IF by a feedback circuit 56. The 10.7 megahertz signal causes the mixer 54 to yield an output signal on line 62 that is proportional to the frequency of the signal modulating the 10.7 megahertz IF. (The feedback circuit 56 causes the oscillator 58 to lock 90 degrees from the phase of the I.F. signal). This baseband frequency modulated signal is fed to a low pass filter 64 and then to a high gain baseband amplifier 66. Baseband amplifier 66 has a break point of about five kilohertz for discrimination against the left plus right FM stereo channel. This breakpoint also minimizes distortion caused by the main audio channel bleeding into the subcarrier channel. The high end rolloff breakpoint is at about 150 kilohertz. The output of the baseband amplifier 66 is provided to conventional decoder circuitry, as disclosed in the Gaskill et al. patent.

A second synchronous detector is also driven by the IF chain 14 and provides an AGC signal for application to the RF and IF gain stages. This second synchronous detector again includes a mixer 68, this one driven from the 10.7 megahertz local oscillator 58 through a 90 degree phase shifter 60. The output of this mixer 68 is thus related to the amplitude of the IF signal and can be used to gain control preceding stages.

The limiting stages found in most FM receivers were found disadvantageous in the present system. Limiting does not benefit the receiver's signal-to-noise or signal-to-interference ratio due to the low modulation index of the subcarrier being decoded. Consequently, the automatic gain control technique was employed.

The AGC circuitry 30 employed in the preferred embodiment of the present invention is disclosed in pending allowed application Ser. No. 07/196,946 now U.S. Pat. No. 4,870,372 of Suter entitled "AGC Delay on an Integrated Circuit," the disclosure of which is incorporated herein by reference. An AGC loop filter 70 is a single RC stage with a break point at about one kilohertz. All other bypassing of AGC points is done with much higher break points so that the one pole is clearly dominant.

FREQUENCY CONTROL SYSTEM

In the Gaskill system, each paging receiver is periodically energized for a short interval, such as 33 milliseconds, and tuned to a frequency on which paging signals are expected. If paging signals are not found, the receiver undertakes a scan of other broadcast frequencies.

To effect the frequency agility required in this system, the local oscillator 42 includes a fractional-N synthesizer. Referring again to FIG. 1, this oscillator includes first and second programmable divider circuits 81, 82, a digital mixer 83, a loop filter 84, a voltage controlled oscillator 85, and a divide-by-four circuit 86, all connected in a servo loop arrangement.

Fractional-N synthesizers of this type are well known. To review briefly, the first divider circuit 81 divides a signal applied to its input 87 by either 31 or 32, depending on data provided to a control input 88 by the control microprocessor 27. The second divider circuit 82 similarly divides the signal output from the first divider circuit by N, where N is again a datum provided to a control input 90 by the microprocessor 27. The twice-divided signal is provided on line 91 to a mixer 83 that mixes it with a 50 KHz reference clock signal. This mixer produces a difference term that represents the difference in phase between the signal on line 91 and the reference clock signal. (If the phase difference is greater than 360 degrees, the difference term becomes a difference frequency.) This difference term is filtered from the other mixer products by the loop filter 84 and is applied to an input of the voltage controlled oscillator 85. These servo loop components cooperate together in their operation so that the frequency output by this oscillator is maintained at 50N KHz.

Figure 2:
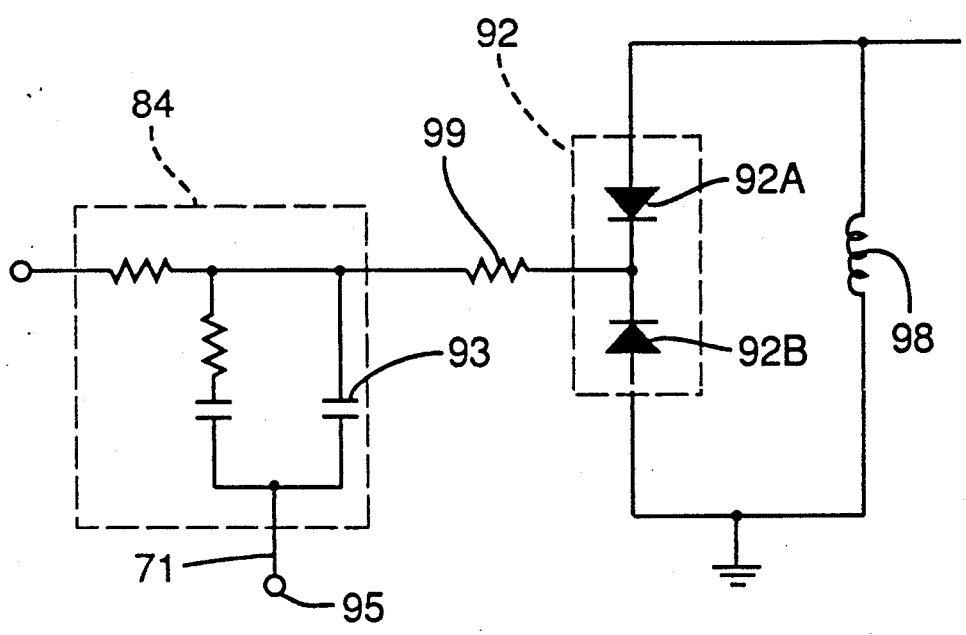
FIG. 2 illustrates a portion of a local oscillator interface circuit used in the receiver of FIG. 1.

FIG. 2 shows the connection between loop filter 84 and voltage controlled oscillator 85. The output voltage from the loop filter 84 appears across capacitor 93. Varactor network 92 which includes varactors 92A and 92B together with inductance 98 are the frequency determining elements of oscillator 85. The voltage across capacitor 93 is applied to varactors 92A and 92B through a decoupling resistor 99. The varactor network 92 controls the frequency of the oscillator 85 in response to the voltage on capacitor 93.

To eliminate noise from the digital dividers and mixer in the synthesizer, the control microprocessor deenergizes these components after the charge on the storage capacitor 93 has stabilized. In the illustrated embodiment, this takes about 4 milliseconds. For the remainder of the 33 millisecond listening interval, the voltage controlled oscillator relies on the capacitor 93 to maintain the receiver on the desired frequency.

Naturally, the storage capacitor 93 begins to discharge during this second portion of the listening interval, causing the receiver to drift off frequency. To compensate for such drift, an AFC signal is applied to terminal 95. This AFC signal is taken from the output of the first synchronous detector 54 (which produces an output signal related to the frequency of the IF signal), amplified by an amplifier 72, routed through a switch 74 and applied to the second varactor terminal. As the capacitor 93 discharges and the local oscillator 42 tends to drift, a corresponding compensation signal is generated by the drifting IF signal on the AFC line 71, returning the receiver to its original frequency.

It will be recognized that the AFC control loop not only tracks drift caused by discharge of the storage capacitor, but also corrects frequency errors caused by changes in supply voltage, ambient temperature, etc.

Switch 74 is activated by the control microprocessor 27 to apply the AFC signal to the varactor at the same time the microprocessor shuts down the synthesizer. While the synthesizer is operative, the switch is in a second position in which it applies a reference voltage to the varactor. This reference voltage is selected to correspond to the signal generated on AFC line 71 when the received signal is properly centered in the IF passband.

In the illustrated embodiment, the tuning voltage applied across the varactor 92 spans a 4.5 volt range, from −2.25 volts to 2.25 volts, and is generated by a voltage doubler circuit from a nominal 2.25 volt receiver supply voltage. The nominal AFC voltage is approximately 200 millivolts below this supply voltage and can vary plus or minus 200 millivolts.

The foregoing arrangement not only eliminates noise from the synthesizer; it also reduces battery power. The power consumption of the receiver circuitry drops about 20 to 25% percent when the synthesizer is shut down and frequency control is left to the AFC loop.

Having illustrated the principles of our invention with reference to a preferred embodiment, it should be apparent that the invention can be modified in arrangement and detail without departing from such principles. For example, while the invention has been illustrated with reference to a receiver that is intermittently operated, the same principles can similarly be applied to a receiver that is operated continuously. In such a system, the synthesizer can be activated for brief intervals periodically and the frequency control can be left to the AFC loop for the intervening intervals.

In view of the wide variety of embodiments to which the principles of our invention may be applied, it should be recognized that the illustrated embodiment is to be considered illustrative only and not as limiting the scope of our invention. Accordingly, we claim as our invention all such modifications as may come within the scope and spirit of the following claims and equivalents thereto.

We claim:

1. A method of operating a receiver comprising repetitively: digitally generating a first frequency control voltage for a first time period; storing said first frequency control voltage in a capacitor;

applying a voltage across the capacitor to a voltage responsive tuning element to thereby tune the receiver to a first channel;

discontinuing generation of the first frequency control voltage at the end of the first time period, thereby permitting the voltage applied by the capacitor to the voltage responsive tuning element to diminish during a second time period following the first;

processing an output signal produced by the receiver to generate a second frequency control voltage; and applying said second frequency control signal to augment the voltage of the voltage responsive tuning element during the second time period so as to compensate for the diminishing voltage applied thereby by the capacitor;

applying said first frequency control voltage to a first terminal of the capacitor during the first time period; and applying said second frequency control voltage to a second terminal of the capacitor during the second time period.

* * * * *